(12) United States Patent
Hamabe et al.

(10) Patent No.: US 10,903,893 B2
(45) Date of Patent: Jan. 26, 2021

(54) RADIO WAVE MEASUREMENT DEVICE

(71) Applicant: Panasonic Intellectual Property Management Co., Ltd., Osaka (JP)

(72) Inventors: Taichi Hamabe, Osaka (JP); Tatsuhiko Numoto, Osaka (JP); Shinkuro Fujino, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 301 days.

(21) Appl. No.: 16/042,089

(22) Filed: Jul. 23, 2018

(65) Prior Publication Data

US 2018/0351631 A1    Dec. 6, 2018

Related U.S. Application Data

(63) Continuation of application No. PCT/JP2016/005078, filed on Dec. 7, 2016.

(30) Foreign Application Priority Data

Feb. 3, 2016 (JP) ................................ 2016-018579

(51) Int. Cl.
*H04B 7/10* (2017.01)
*G01R 29/08* (2006.01)
(Continued)

(52) U.S. Cl.
CPC ........... *H04B 7/10* (2013.01); *G01R 29/0878* (2013.01); *G01R 29/0892* (2013.01);
(Continued)

(58) Field of Classification Search
CPC ........ H04B 7/10; H04B 7/0805; H04B 17/27; H04B 17/318; H04B 1/44; H01Q 21/30;
(Continued)

(56) References Cited

U.S. PATENT DOCUMENTS

2001/0016477 A1    8/2001   Harano
2013/0344820 A1   12/2013   Ikonen et al.
2016/0020648 A1*   1/2016   Contopanagos ..... H01Q 15/006
                                                               307/104

FOREIGN PATENT DOCUMENTS

ES        2353104        2/2011
JP     56-144645        11/1981
(Continued)

OTHER PUBLICATIONS

Chinese Search Report dated Dec. 18, 2019 in corresponding Chinese Patent Application No. 201680080683.3, with English translation.
(Continued)

*Primary Examiner* — Son T Le
(74) *Attorney, Agent, or Firm* — Wenderoth, Lind & Ponack, LLP

(57) ABSTRACT

A radio wave measurement device includes a housing having a metallic layer, and a horizontal polarization antenna and a vertical polarization antenna that are both disposed on one face of the housing. The horizontal polarization antenna receives horizontally polarized waves, whereas the vertical polarization antenna receives vertically polarized waves. The radio wave measurement device further includes a switching unit connected to both the horizontal polarization antenna and the vertical polarization antenna, and an output unit connected to the switching unit. The switching unit includes a connection part connected to the output unit and a resistance part connected to a resistor. The switching unit switches between the antennas such that only one of the horizontal polarization antenna and the vertical polarization antenna is connected to the connection part, and the other antenna is connected to the resistor.

8 Claims, 16 Drawing Sheets

(51) Int. Cl.
| | |
|---|---|
| *H01Q 21/30* | (2006.01) |
| *H04L 12/28* | (2006.01) |
| *H01Q 15/00* | (2006.01) |
| *H01Q 3/24* | (2006.01) |
| *H01Q 3/44* | (2006.01) |
| *H04B 7/08* | (2006.01) |
| *H04B 17/27* | (2015.01) |
| *H04B 17/318* | (2015.01) |
| *H04B 1/44* | (2006.01) |

(52) U.S. Cl.
CPC ............... *H01Q 3/242* (2013.01); *H01Q 3/44* (2013.01); *H01Q 15/0086* (2013.01); *H01Q 21/30* (2013.01); *H04B 7/0805* (2013.01); *H04L 12/2801* (2013.01); *H04B 1/44* (2013.01); *H04B 17/27* (2015.01); *H04B 17/318* (2015.01); *H04L 12/28* (2013.01)

(58) Field of Classification Search
CPC ...... H01Q 15/0086; H01Q 3/242; H01Q 3/44; H04L 12/2801; H04L 12/28; G01R 29/0878; G01R 29/0892; G01R 1/28; G01R 19/2509; G01R 31/28; G01R 31/2822; G01R 1/04
See application file for complete search history.

(56) References Cited

FOREIGN PATENT DOCUMENTS

| | | |
|---|---|---|
| JP | 2001-230709 | 8/2001 |
| JP | 2006-125951 | 5/2006 |
| JP | 2007-027902 | 2/2007 |
| JP | 2014-502813 | 2/2014 |
| WO | 2012/089236 | 7/2012 |

OTHER PUBLICATIONS

Kotaka et al., "A study of a diplole antenna unifying with AMC substrate", The Institute of Electronics, Information and Communication Engineers, pp. 25-30, 2015, with partial English translation.
International Search Report of PCT application No. PCT/JP2016/005078 dated Feb. 28, 2017.
Masaki Kotaka, Tetsuro Moroya, Shigeru Makino, Hideyuki Hayashi, Keisuke Noguchi, Tetsuo Hirota, Kenji Ito, Taichi Hamabe, "A study of a dipole antenna unifying with AMC substrate", Proceedings of the 2015 IEICE General Conference Tsushin 1, Feb. 24, 2015 (Feb. 24, 2015), p. 107 (with Partial Translation).
English Translation of Chinese Search Report dated Aug. 12, 2020 in corresponding Chinese Patent Application No. 201680080683.3.

\* cited by examiner

RADIO WAVE MEASUREMENT DEVICE

TECHNICAL FIELD

The present disclosure relates to a radio wave measurement device for measuring a radio wave environment.

BACKGROUND ART

Unexamined Japanese Patent Publication No. 2006-125951 discloses a system that associates measurement point positions with radio wave intensities (electric field intensities) for a radio wave environment and stores associated data. This system includes a position detector, a field intensity detector, and a visualized data processing unit. This enables the measurement of both coordinate positions and electric field intensities, and provides a distribution map of measured data.

SUMMARY OF THE INVENTION

A radio wave measurement device according to the present disclosure includes a housing having a metallic layer, and a horizontal polarization antenna and a vertical polarization antenna that are both disposed on one face of the housing. The horizontal polarization antenna receives horizontally polarized waves, whereas the vertical polarization antenna receives vertically polarized waves. The radio wave measurement device further includes a switching unit connected to both the horizontal polarization antenna and the vertical polarization antenna, and an output unit connected to the switching unit. The switching unit includes a connection part connected to the output unit and a resistance part connected to a resistor. The switching unit switches between the antennas such that only one of the horizontal polarization antenna and the vertical polarization antenna is connected to the connection part, and the other antenna is connected to the resistor.

A radio wave measurement device according to the present disclosure can measure radio waves in a plurality of conditions in a short period of time.

DESCRIPTION OF EMBODIMENTS

Hereinafter, exemplary embodiments will be described in detail with reference to the drawings as appropriate. However, detailed description may be omitted as necessary. For example, a detailed description of already well-known matters or a redundant description of substantially the same configuration will not be repeated. This is to avoid unnecessary redundancy in the following description and to facilitate understanding by those skilled in the art.

The accompanying drawings and the following description are provided to enable those skilled in the art to fully understand the present disclosure, and are not intended to limit the gist of the present disclosure.

First Exemplary Embodiment

Figure 1:
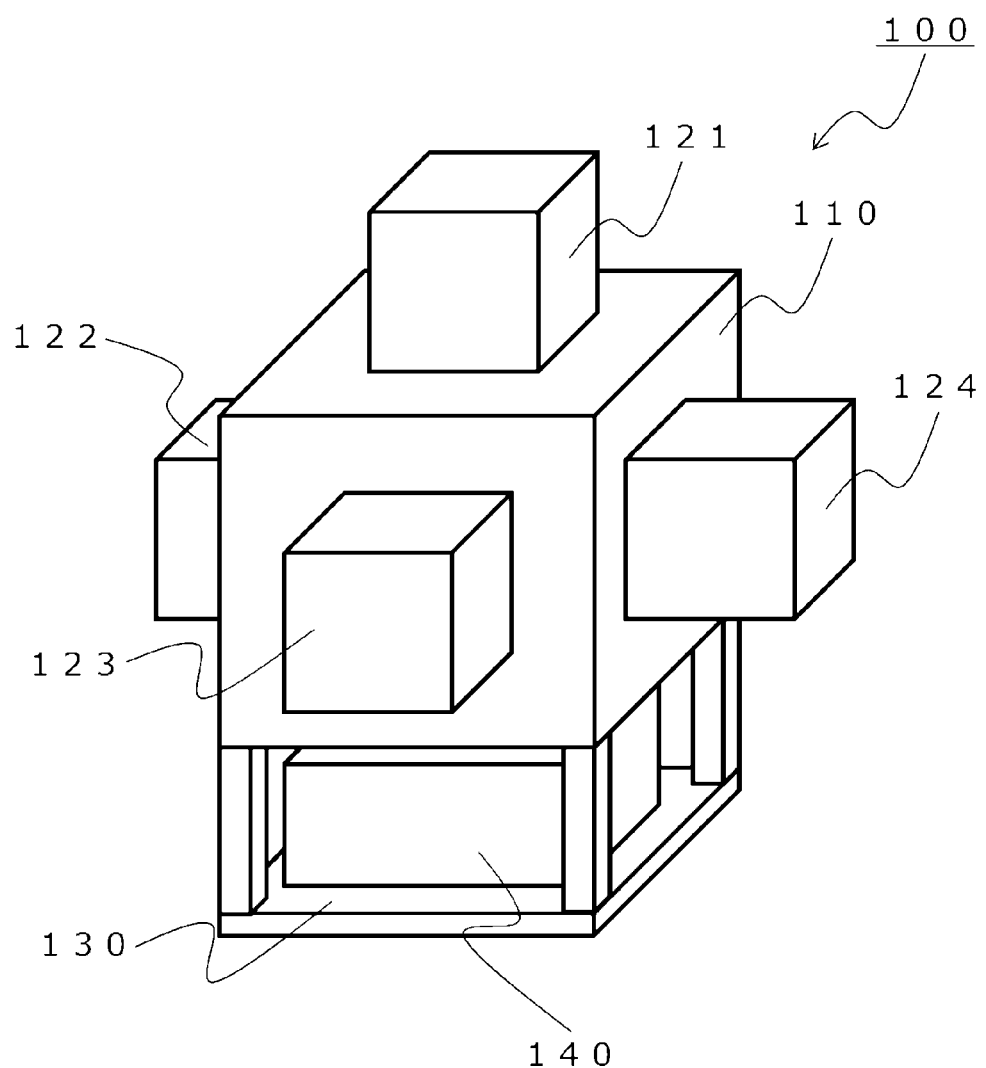
FIG. 1 is an external view of a radio wave measurement device according to a first exemplary embodiment.
Figure 2:
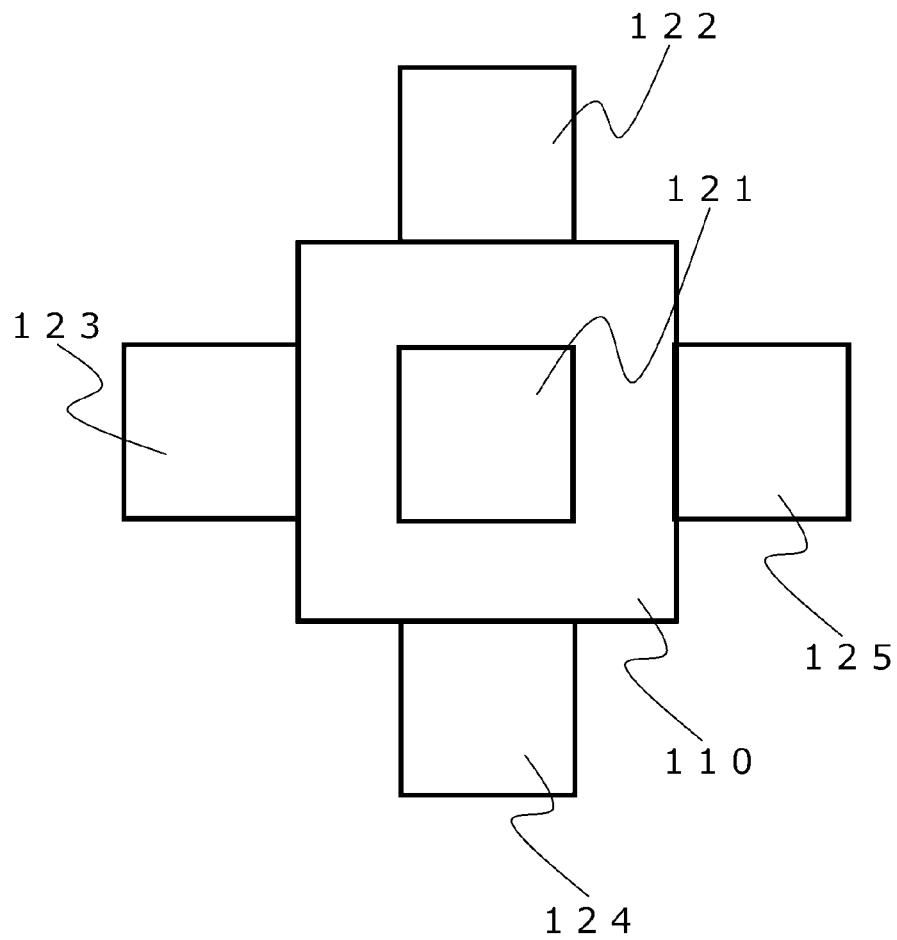
FIG. 2 is an external view of the radio wave measurement device according to the first exemplary embodiment.
Figure 3:
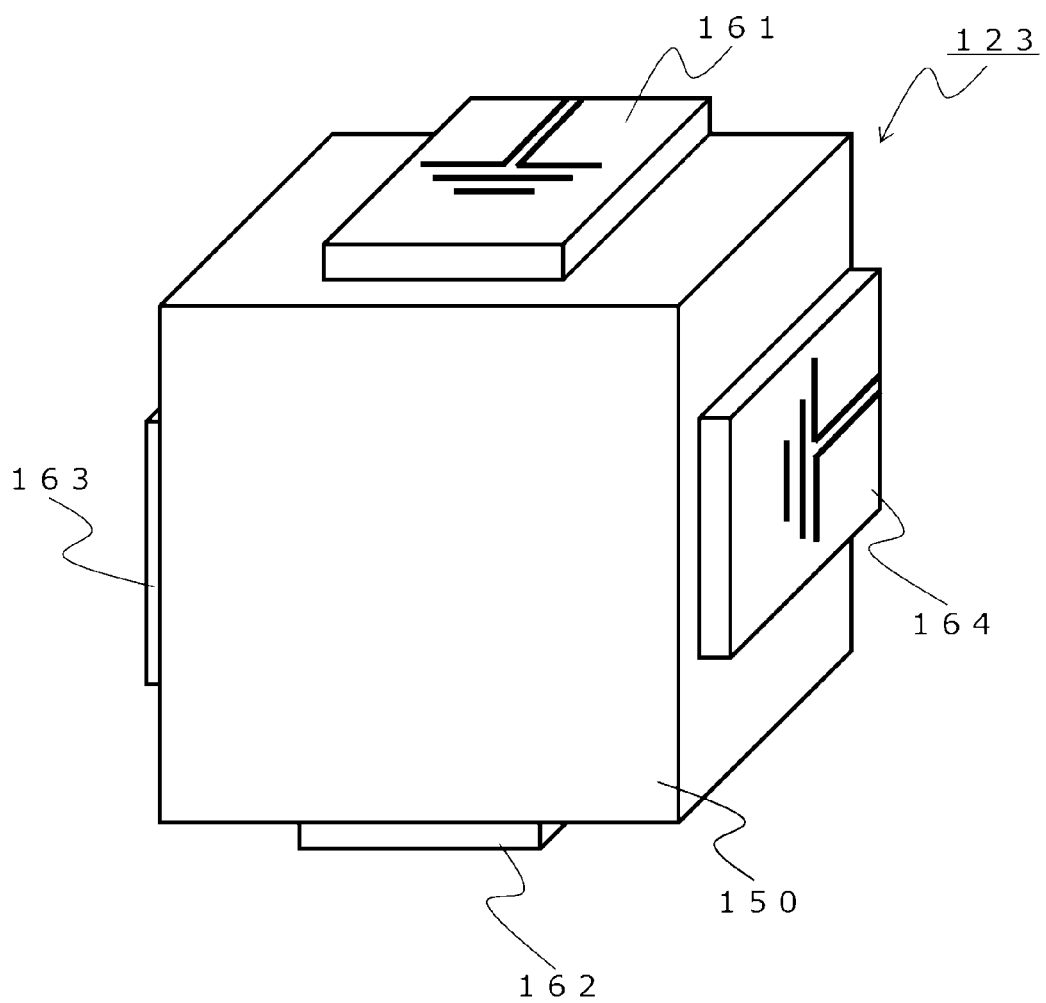
FIG. 3 is a perspective view of antennas according to the first exemplary embodiment.
Figure 4:
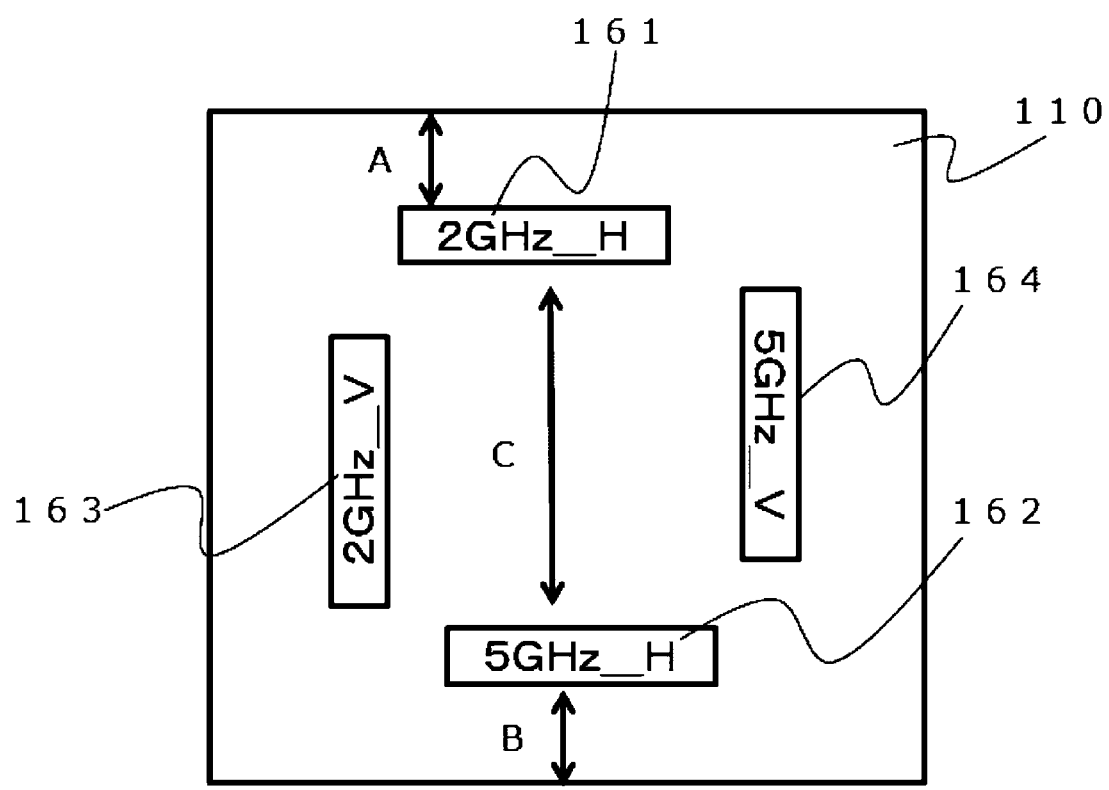
FIG. 4 is a layout sketch of the antennas according to the first exemplary embodiment.

A first exemplary embodiment will now be described with reference to FIGS. 1 to 11. A configuration of a radio wave measurement device will be described with reference to FIGS. 1 to 4. FIG. 1 is an external view of a radio wave measurement device according to the first exemplary embodiment. FIG. 2 is an external view of the radio wave measurement device according to the first exemplary embodiment. FIG. 3 is a perspective view of antennas according to the first exemplary embodiment. FIG. 4 is a layout sketch of the antennas according to the first exemplary embodiment.

In FIG. 1, radio wave measurement device 100 includes housing 110 having a quadrangular prism shape and being provided with five antenna units 121 to 125 (antenna unit 125 is shown in FIG. 2). Housing 110 is fastened to seat 130. Control box 140 is disposed between housing 110 and seat 130.

Seat 130 is equipped with wheels or a similar gadget such that radio wave measurement device 100 is movable.

Radio wave measurement device 100 may be provided with a cover to protect against rain or wet weather. However, it is preferable that the cover is made of no metallic material to avoid influence on radio wave measurement.

Control box 140 includes a control unit to control antenna units 121 to 125 and an output unit to connect with a measuring instrument, for example. The measuring instrument measures radio waves received by antenna units 121 to 125. The measuring instrument may be disposed inside control box 140 or may be separately disposed outside control box 140.

With reference to FIG. 2, a disposition of antenna units 121 to 125 will be described. FIG. 2 is a top view of radio wave measurement device 100. As shown in FIG. 2, antenna unit 121 is disposed on a top face of the housing, whereas antenna units 122 to 125 are disposed on respective four lateral faces of housing 110. No antenna unit is disposed on an underside of housing 110 because of the disposition of control box 140. However, an antenna unit may be disposed on the underside of housing 110 as needed.

Since radio wave measurement device 100 of the exemplary embodiment is provided with antennas on five faces, i.e. the top face and the lateral faces of the housing, radio wave measurement device 100 can receive incoming radio waves in five directions. A metallic shield is provided on a surface of housing 110 to ensure that an antenna receiving radio waves in one of the directions is not influenced by radio waves coming in the other (four) directions. The faces of housing 110 may each include laminated layers and one of the layers may be made of a metal.

With reference to FIG. 3, antenna units 121 to 125 will now be described in detail. The following description is given by taking antenna unit 123, which is located at a front of radio wave measurement device 100 in FIG. 1, as an example. The other antenna units are the same as antenna unit 123 in configuration.

Antenna unit 123 is provided with a plurality of antennas. The antennas are fastened in place by fastener 150. Specifically, these antennas are horizontal polarization antennas 161, 162 that receive horizontally polarized waves and vertical polarization antennas 163, 164 that receive vertically polarized waves. These four antennas are disposed on respective substrates.

In this exemplary embodiment, these four antennas are a combination of antennas that support both horizontally and vertically polarized waves with different frequencies. The four antennas are horizontal polarization antenna 161 for a 2-GHz frequency band, vertical polarization antenna 163 for a 2-GHz frequency band, horizontal polarization antenna 162 for a 5-GHz frequency band, and vertical polarization antenna 164 for a 5-GHz frequency band.

However, the combination of the antennas may be freely changed. The antennas may be replaced with antennas that cover an identical frequency band or antennas that support either horizontally or vertically polarized waves.

The antennas may be circular polarization antennas other than horizontal or vertical polarization antennas. A number of the antennas may be any.

Fastener 150 is made of a material that has no influence on radio wave measurement. Unlike housing 110, fastener 150 includes no metallic shield.

Antenna unit 123 is disposed such that a face where a feedpoint for horizontal polarization antennas 161, 162 and vertical polarization antennas 163, 164 exists (a backside having no antenna in FIG. 3) is in contact with housing 110. In other words, the antenna unit is disposed such that the substrates provided with horizontal polarization antennas 161, 162 and vertical polarization antennas 163, 164 are at right angles to the face of housing 110.

With reference to FIG. 4, a relationship between housing 110 and horizontal polarization antennas 161, 162, as well as vertical polarization antennas 163, 164 of antenna unit 123 will be described.

As shown in FIG. 4, horizontal polarization antennas 161, 162 and vertical polarization antennas 163, 164 are disposed such that horizontal polarization 2 GHz-band antenna (2 GHz_H) 161, vertical polarization 2 GHz-band antenna (2 GHz_V) 163, horizontal polarization 5 GHz-band antenna (5 GHz_H) 162, and vertical polarization 5 GHz-band antenna (5 GHz_V) 164 form a quadrilateral.

In the meantime, if the horizontal and vertical polarization antennas are near respective ends of housing 110, the antennas are influenced by radio waves reaching the other faces. Thus, the horizontal and vertical polarization antennas are disposed inward from the respective ends of the housing by one fourths of wavelengths ($\lambda/4$) of the respective antennas (shown with A and B in FIG. 4) to avoid being influenced by radio waves reaching the other faces.

In this exemplary embodiment, horizontal polarization 2 GHz-b and antenna 161 operates in a range of 1.7 GHz to 3.0 GHz frequencies, whereas horizontal polarization 5 GHz-band antenna 162 operates in a range of 2.4 GHz to 6.0 GHz frequencies. The frequency bands for the antennas partly overlap each other. Thus, the antennas are disposed at a distance of $\lambda/2$ or greater from each other (shown with C in FIG. 4) so as to prevent interference between the antennas. The distance here is determined based on a wavelength $\lambda$ for 2.4 GHz, the lowest frequency out of the overlapping frequencies. Although the preceding description is given by taking the horizontal polarization antennas as an example, the vertical polarization antennas are disposed in a similar manner.

Figure 5:
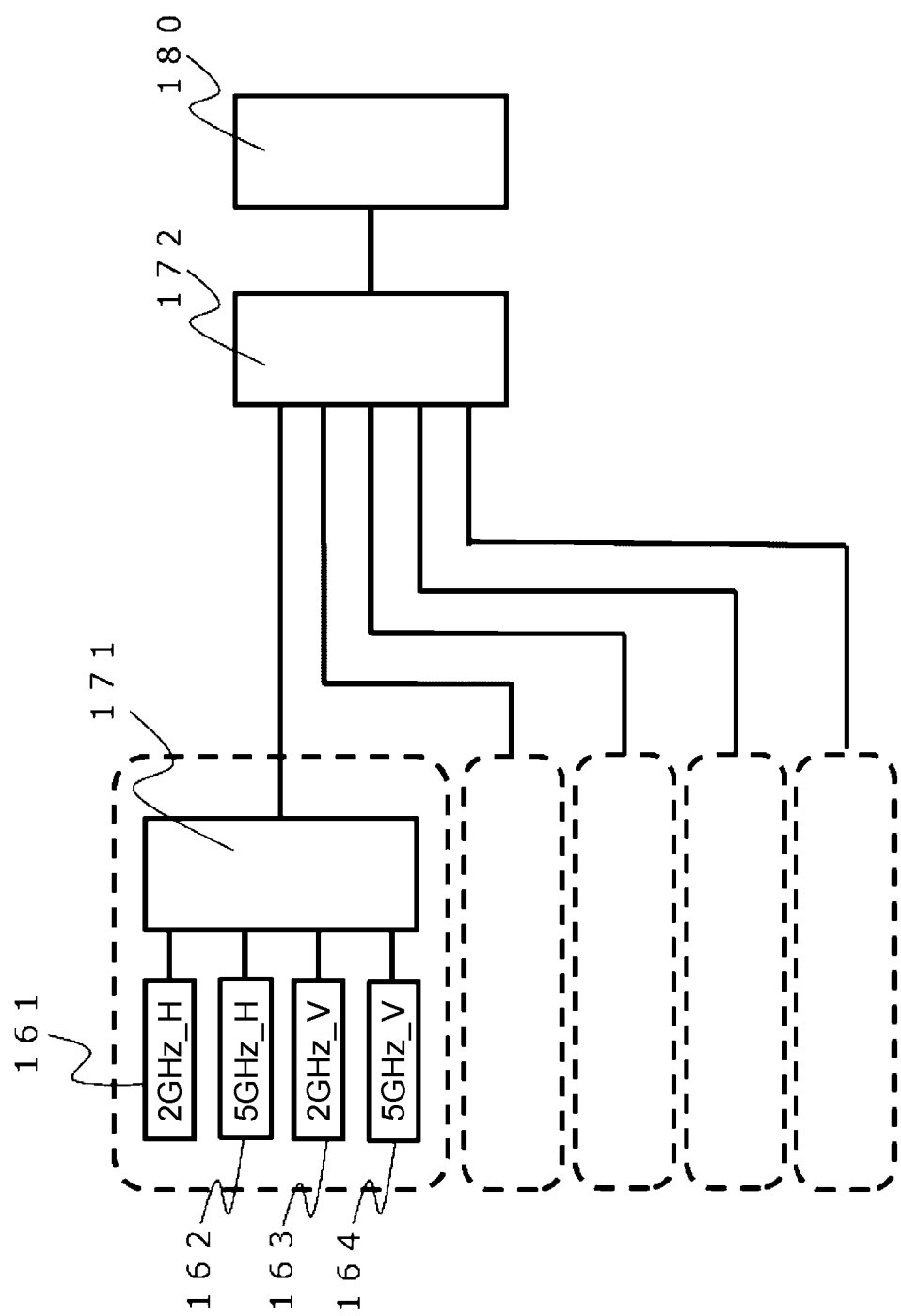
FIG. 5 is a block diagram of the radio wave measurement device according to the first exemplary embodiment.

With reference to FIG. 5, a description will be given of connection of the antennas in the radio wave measurement device configured as described above. FIG. 5 is a block diagram of the radio wave measurement device according to the first exemplary embodiment.

All the antennas positioned on an identical face of housing 110 are connected to identical switch 171. Antennas positioned on the other faces of housing 110 are connected to separate switches. Sections enclosed with dashed lines in FIG. 5 correspond to the respective faces of the housing and each have an identical configuration. In other words, the sections are provided with respective switches 171 that correspond to the respective faces of the housing, i.e. antenna units 121 to 125.

All switches 171 provided for the respective faces of the housing are connected to switch 172. In other words, all antenna units 121 to 125 are connectible to switch 172 via switches 171. One antenna, for example, horizontal polarization 2 GHz-band antenna 161, out of all the antennas is connected with output unit 180 via switches 171, 172.

The measuring instrument, such as a spectrum analyzer, can measure radio waves received by radio wave measurement device 100 because of connections established from switch 172 to output unit 180 and from output unit 180 to the measuring instrument.

Switch 172 may be integrated with output unit 180.

Figure 6:
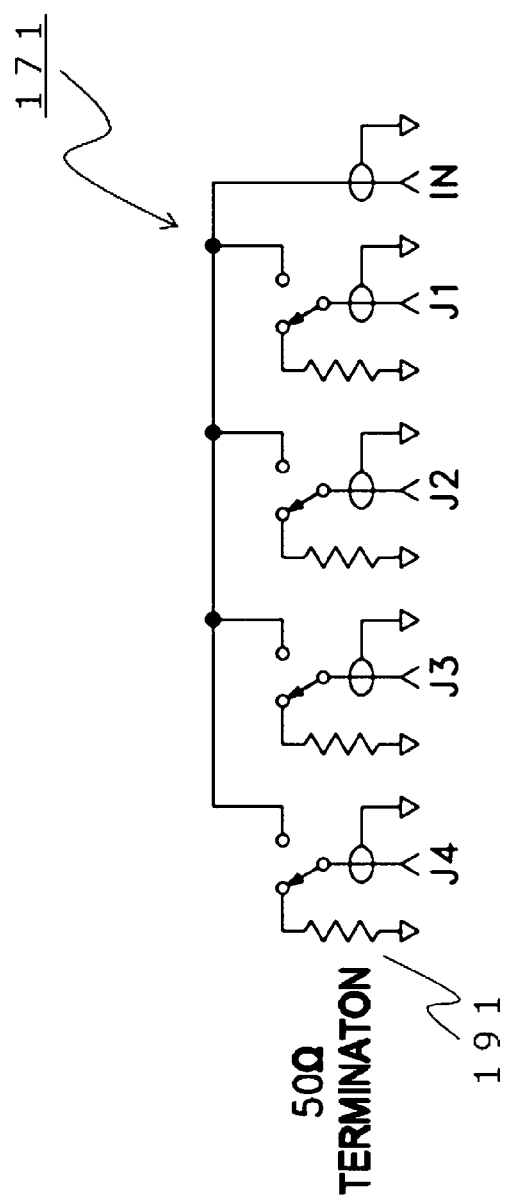
FIG. 6 is a circuit diagram of a switch according to the first exemplary embodiment.

With reference to FIG. 6, a configuration of switch 171 will now be described. FIG. 6 is a circuit diagram of a switch according to the first exemplary embodiment. Switch 171 has five terminals. Switch 172 is connected to the terminal of IN, whereas horizontal polarization antennas 161, 162 and vertical polarization antennas 163, 164 are connected to terminals J1 to J4. Terminals J1 to J4 are each provided with 50-ohm termination resistor 191. The terminals are each allowed to select connection to any one of IN and termination resistor 191.

If switch 171 is connected to output unit 180 via switch 172, only one of terminals J1 to J4 is connected to IN, and the remaining terminals that are not connected to IN are connected to respective termination resistors 191. If switch 171 is not connected to output unit 180, all terminals (J1 to J4) are connected to respective termination resistors 191. Switch 171 selects the terminal for connection to IN among J1 to J4 in response to a command from the measuring instrument or the like.

The radio wave measurement device allows switch 171 to select terminal connection as described above in order to diminish influence from the antennas that are not connected to IN, that is, the measuring instrument. In particular, a plurality of the antennas exist on the same face of the housing. This may cause the antenna to come under the influence of radio waves received by the other antennas on the same face that are not subject to measurement. Thus, the radio wave measurement device connects the antennas that are not in use for measurement to termination resistors 191 and thereby diminishes influence from elements other than the antenna subject to measurement. Preferably, switch 172 has a configuration similar to the configuration of switch 171 to diminish influence as well from antennas on the other faces of the housing.

Figure 7:
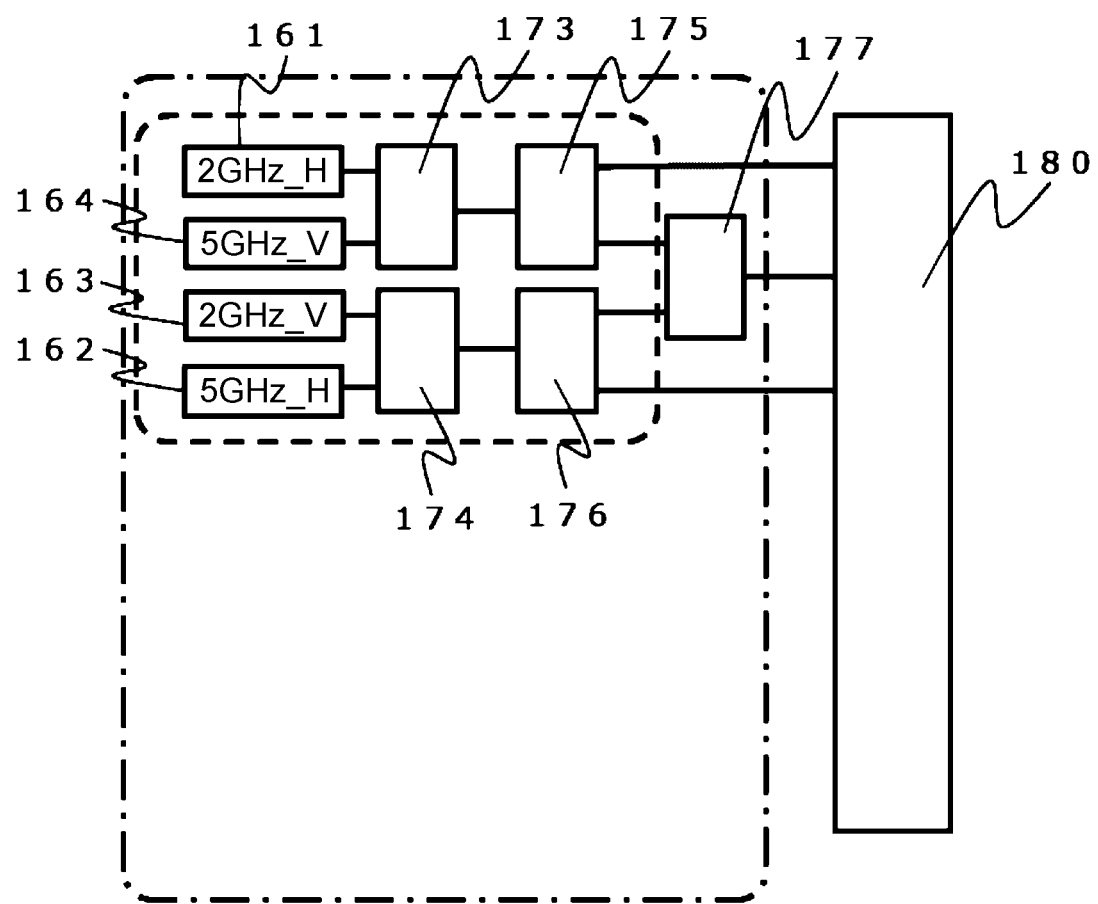
FIG. 7 is a block diagram of a radio wave measurement device according to the first exemplary embodiment.

The radio wave measurement device may have a configuration as shown in a block diagram of FIG. 7. The block diagram of FIG. 7 differs from the block diagram of FIG. 5 in that only two antennas are directly connected to a switch.

Specifically, horizontal polarization 2 GHz-band antenna 161 and vertical polarization 5 GHz-band antenna 164 are connected to switch 173, whereas vertical polarization 2 GHz-band antenna 163 and horizontal polarization 5 GHz-band antenna 162 are connected to switch 174. Switch 173 and switch 174 can each select one antenna out of the connected antennas.

Switches 173, 174 share a basic configuration with switch 171 and each have terminals connected to antennas, although a number of the terminals is half of a number of the terminals included in switch 171.

Switch 173 is connected to switch 175, whereas switch 174 is connected to switch 176. Switch 175 is connected to both output unit 180 and switch 177 and establishes connection to any one of output unit 180 and switch 177. Switch 176 is connected to both output unit 180 and switch 177 and establishes connection to any one of output unit 180 and switch 177. Switch 177 is connected to output unit 180.

The measuring instrument, such as a spectrum analyzer, is connected to output unit 180 as described above and can measure radio waves received by the radio wave measurement device. Unlike the configuration of FIG. 5, the four antennas are connected to two separate switches 173, 174. As a result, the measuring instrument can simultaneously measure radio waves that are received using the antenna connected to switch 173 and the antenna connected to switch 174. This configuration enables radio wave measurement with improved efficiency.

Preferably, antennas connected to switch 173 are a combination of antennas that support radio waves polarized in different directions, and it is more preferable that these antennas are, as shown in FIG. 7, a combination of antennas for radio waves that are not only polarized differently but also have different frequencies. (The same applies to switch 174.)

A method of measurement by radio wave measurement device 100 configured as described above will be described. Radio wave measurement device 100 can receive radio waves from an apparatus such as a Wireless Fidelity (Wi-Fi) compatible device and measure quantities or intensities of radio waves (electric field intensities) received from the apparatus or the Wi-Fi compatible device by establishing connection with the measuring instrument, for example.

Specifically, radio wave measurement device 100 switches between the antennas on each of the faces of housing 110 and thereby measures radio waves coming to radio wave measurement device 100 in the five directions.

Examples of measurable items in this exemplary embodiment include electric power (radio wave intensity) and delay spread.

In the measurement of electric power, the radio wave measurement device can measure radio wave intensities of horizontally and vertically polarized waves at a certain frequency in the five directions by a spectrum analyzer.

As for delay spread characterization, taking advantage of the capability to measure radio waves in the five directions, the radio wave measurement device can identify directions of incoming reflected waves using a network analyzer and visualize measurements such as radio waves absorbed by a wall or other obstacles.

Figure 8:
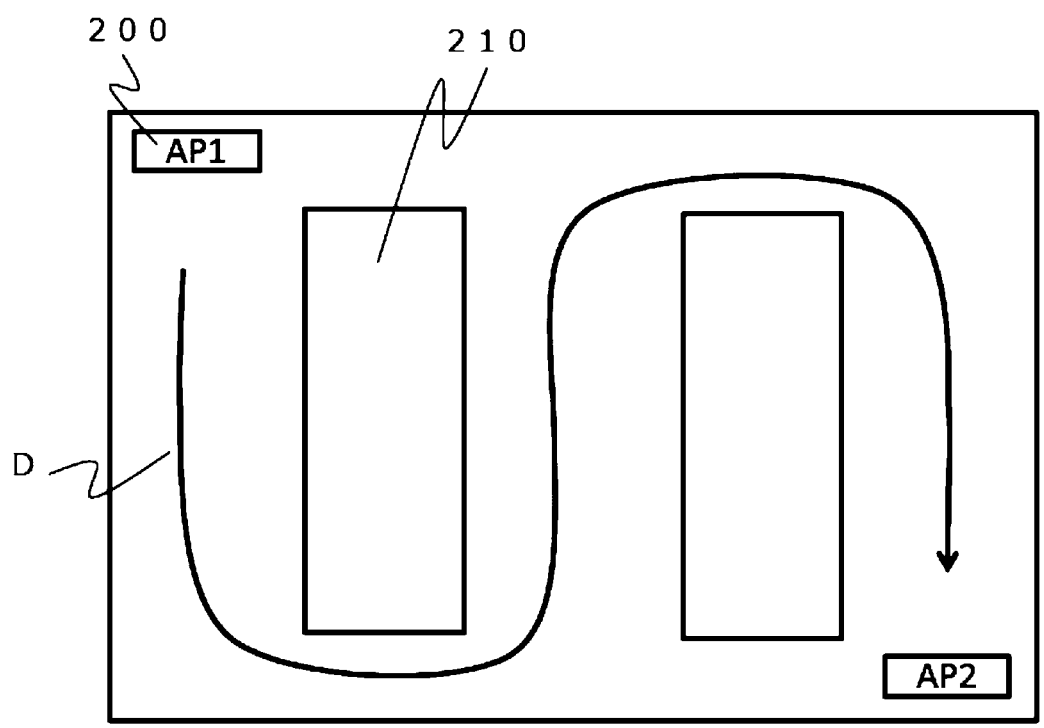
FIG. 8 is a conceptual drawing illustrating measurement according to the first exemplary embodiment.
Figure 9:
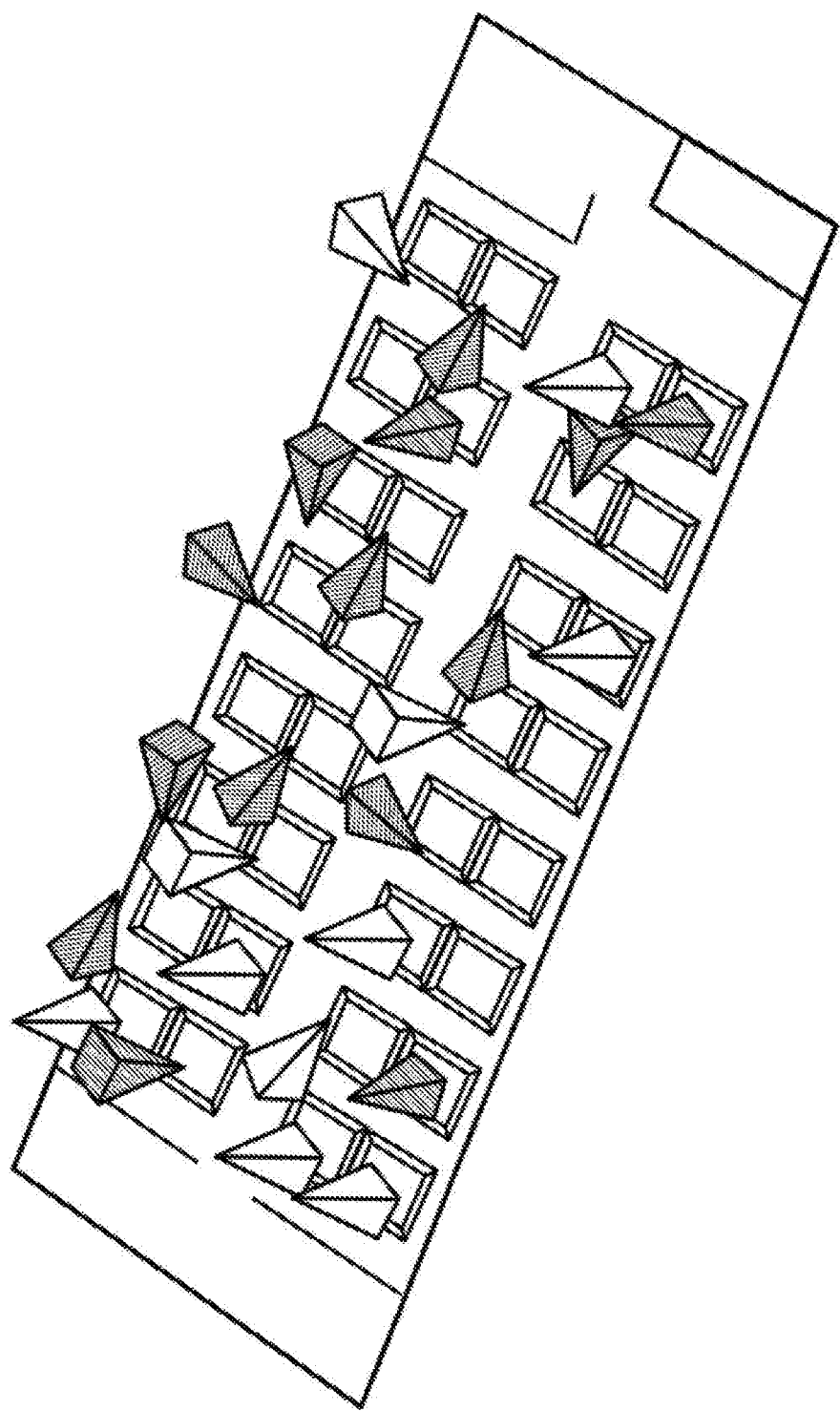
FIG. 9 is a drawing illustrating results of measurement according to the first exemplary embodiment.
Figure 10:
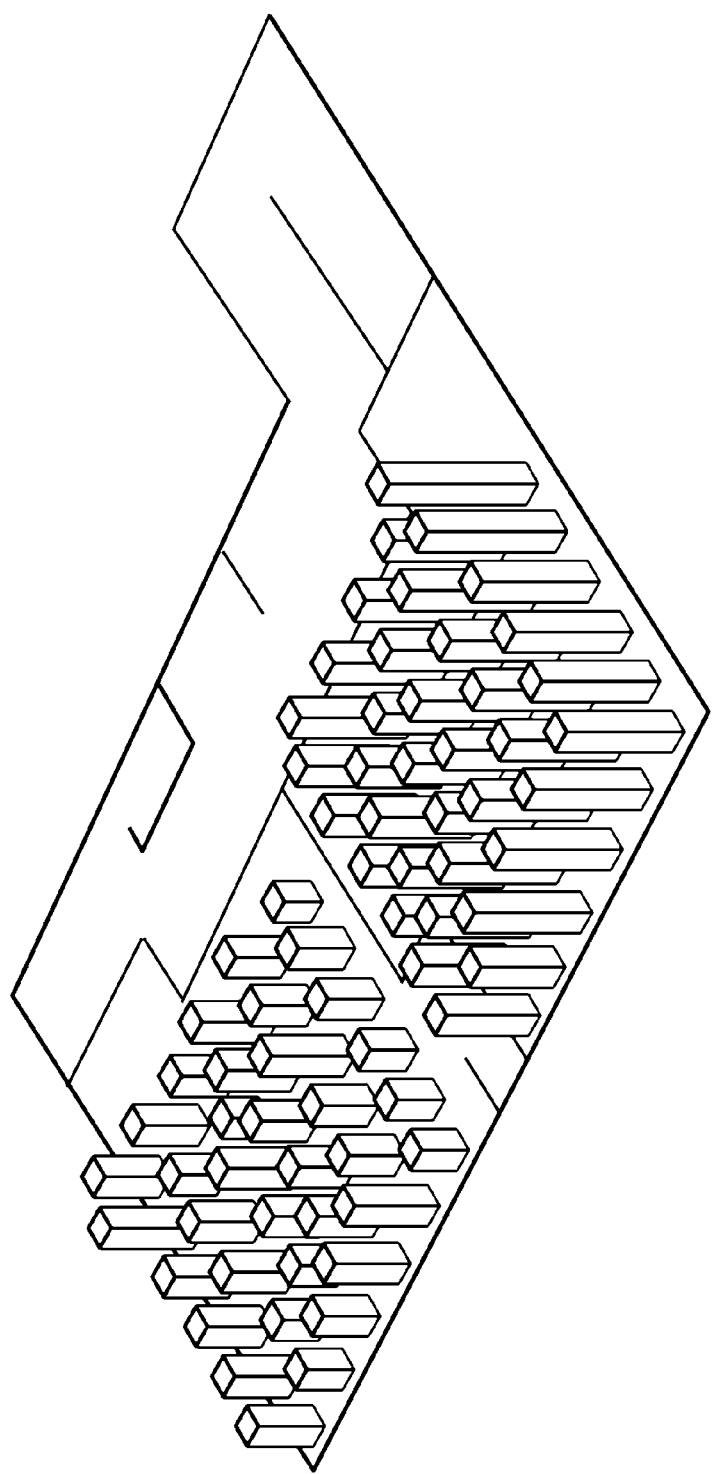
FIG. 10 is a drawing illustrating results of measurement according to the first exemplary embodiment.
Figure 11:
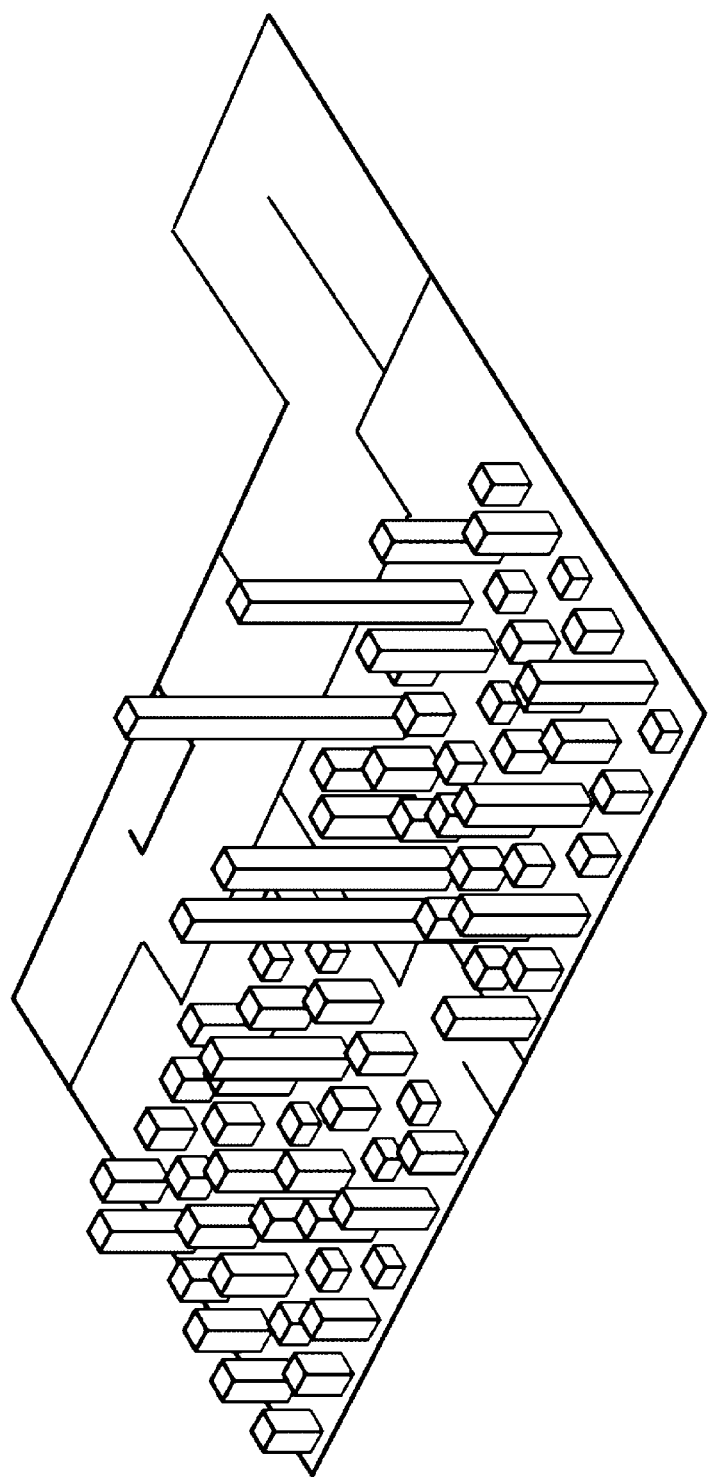
FIG. 11 is a drawing illustrating results of measurement according to the first exemplary embodiment.

With reference to FIGS. 8 to 11, a method of using the radio wave measurement device configured as described above will be described. FIG. 8 is a conceptual drawing illustrating measurement according to the first exemplary embodiment. FIGS. 9 to 11 each illustrate results of measurement according to the first exemplary embodiment. In a space where an antenna incorporating Wi-Fi or other technology is disposed, measurement described above is performed using the radio wave measurement device to measure a radio wave environment in the space.

For example, as shown in FIG. 8, radio waves are measured in a room where two access points 200 (AP1, AP2) are disposed. In the room, obstacles 210 such as a desk are disposed.

A radio wave environment in this room is measured at points by moving along a route shown with D in FIG. 8, for example. According to results obtained at these measurement points, a radio wave environment can be determined in consideration of influence from wall surfaces, obstacles 210, and other hindrance in the room. In other words, radio wave propagation can be checked anywhere in the room.

By shifting access point 200 to an optimal position or increasing a number of access points 200 in accordance with the determined radio wave environment, Wi-Fi or other technology can be used anywhere in the room.

In general, measurement of radio waves traveling in various directions at many points in a room involves moving along the route shown with D in FIG. 8 with a fixed direction in which radio waves are measured and repeating the movement shown with D in FIG. 8 for every measurement direction. As a result, this radio wave environment measurement has taken very long time. In other words, this conventional method necessitates movement every time measurement is conducted in various conditions and takes very long time.

In contrast to the conventional method, the radio wave measurement device according to this exemplary embodiment can measure radio waves while getting the switches to select terminal connection at each of the points and thus eliminates the need for repeating the movement for every measurement direction. This provides a reduction in measurement time. The radio wave measurement device can select any of the measurement directions and other settings only by getting the switches to select terminal connection. This contributes to a reduction in measurement time.

By associating measured radio wave intensities with measurement positions, a map of a radio wave environment can be made and visually displayed. For example, maps can be displayed as shown in FIGS. 9 to 11. Measurement positions are determined using positional information acquired by the Global Positioning System (GPS) or other technology.

FIG. 9 shows results of measurement inside an aircraft. Measurement was performed by moving radio wave measurement device 100 as shown in FIG. 8. A tip of each arrow denotes a position at which radio waves are measured by radio wave measurement device 100. An orientation of the arrow represents a direction in which radio waves are coming. Arrows that are shaded represent horizontally polarized waves, whereas the other arrows represent vertically polarized waves.

At each position, the radio wave measurement device measures radio wave intensities of polarized waves in different directions (five directions in this exemplary embodiment). The arrows in FIG. 9 each show one direction of the directions and wave polarization corresponding to the highest radio wave intensity of the measured radio wave intensities.

This mapping enables a user of the measurement device to view a direction in which radio wave intensity is high at a certain position at a glance and visually see a route of radio wave propagation from an access point.

This allows the disposition of a receiver in a favorable radio wave environment in consideration of an orientation of the receiver if the receiver is installed to communicate with the access point.

If a plurality of access points are installed, the user can visually identify an area where radio waves from the respective access points interfere with each other.

FIG. 9 shows directions and wave polarizations corresponding to highest radio wave intensities. However, directions and wave polarizations corresponding to lowest radio wave intensities may be shown. Mapping in this case enables the user to view a direction in which a receiver should not be disposed.

FIG. 9 shows wave polarizations and directions using arrows. The arrows may be color-coded for different wave polarizations, and the radio wave intensities may be indicated with different color densities or different arrow sizes.

FIGS. 10 and 11 each show results of measurement performed indoors. Measurement was performed while radio wave measurement device 100 is disposed at each measurement position. Specifically, measurement was performed 100 times with one antenna at intervals of 500 msec. Since radio wave measurement device 100 described above has five faces that are each provided with four antennas, measurement with all the antennas took 1,000 sec.

FIG. 10 is a graph that visualizes highest radio wave intensity values of respective measured radio wave intensities. This graph displays highest radio wave intensity values at respective predetermined measurement positions and thereby provides a distribution of radio wave intensities indoors. As a result, the user can determine positional settings such as where to position an access point while viewing this radio wave intensity distribution in consideration of existence of any low radio wave intensity area, for example.

If the graph displays low radio wave intensity values, the graph can visualize a reception area defined by the access point in consideration of influence given by structures and other things indoors.

FIG. 11 is a graph that visualizes radio wave intensity fluctuations acquired at predetermined measurement positions. The graph displays radio wave intensity differences at the respective predetermined measurement positions.

Specifically, plotting intensity differences on the graph involves determining a difference between highest and lowest values of radio wave intensities measured 100 times at a measurement position for every antenna as described above and taking the largest difference of the differences for the respective antennas as a value for the measurement position.

Generally, the radio wave intensity remains constant. An area with a large difference indicates that the radio wave intensity in the area is affected by an external factor. This leads to analysis conducted on the external factor.

Instead of determining the differences for the respective antennas, a difference for radio wave measurement device 100 as a whole may be determined.

Associating a measurement position with a radio wave intensity may involve measuring a radio wave intensity at a certain measurement position and then inputting the measurement position through means such as touching a place equivalent to the measurement position on a map.

As described above, the surface of housing 110 is provided with a metal. The horizontal polarization antennas and the vertical polarization antennas are disposed on each of the faces provided with the metal. The radio wave measurement device of the present exemplary embodiment can switch between the antennas and thereby measure radio waves efficiently. This allows the radio wave measurement device to measure radio waves in a plurality of conditions in a short period of time.

Results of the measured radio waves can be displayed as described above. Accordingly, the radio wave measurement device can find various applications such as determining disposition of an access point.

Second Exemplary Embodiment

A second exemplary embodiment will now be described with reference to FIGS. 12 to 13. A configuration of the second exemplary embodiment is equivalent to that of the first exemplary embodiment except that a different number of antennas are disposed on each antenna unit. Thus, identical components between the first and second exemplary embodiments are denoted by the same reference signs.

Figure 12:
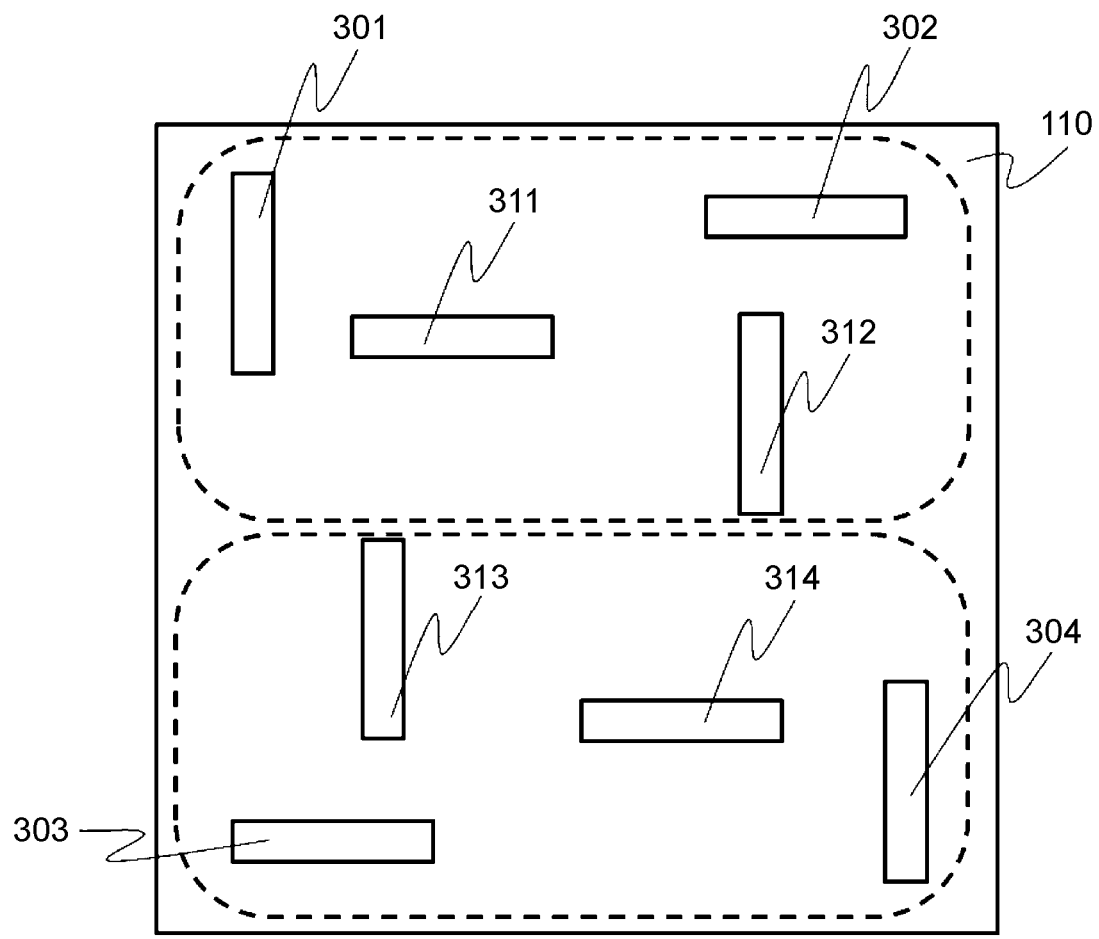
FIG. 12 is a layout sketch of antennas according to a second exemplary embodiment.
Figure 13:
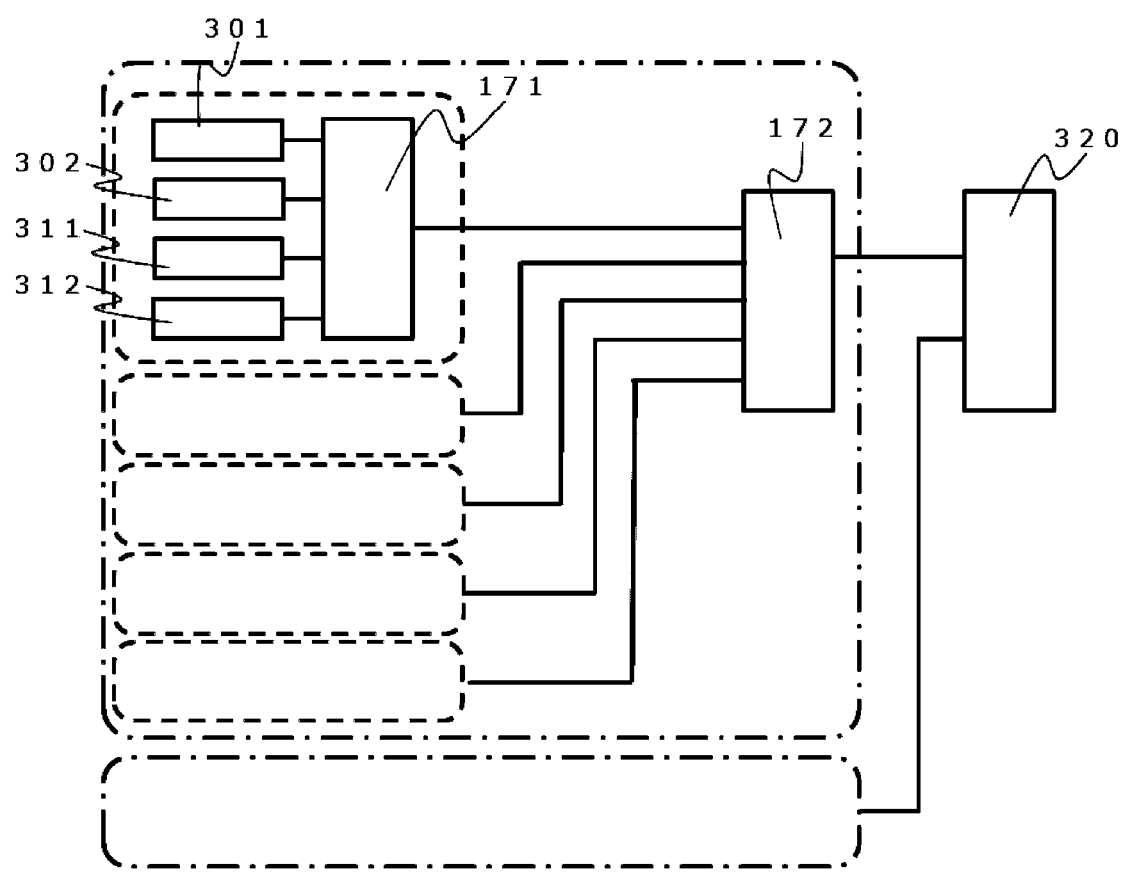
FIG. 13 is a block diagram of a radio wave measurement device according to the second exemplary embodiment.

With reference to FIG. 12, disposition of antennas in the second exemplary embodiment will be described. FIG. 12 is a layout sketch of antennas according to the second exemplary embodiment.

In FIG. 12, 2.4 GHz antennas 301 to 304 and 5.0 GHz antennas 311 to 314 are disposed. Meanwhile, 2.4 GHz antennas 302, 303 and 5.0 GHz antennas 311, 314 are horizontal polarization antennas, whereas 2.4 GHz antennas 301, 304 and 5.0 GHz antennas 312, 313 are vertical polarization antennas.

Concurrently, 2.4 GHz antennas 301 to 304 are disposed outward of 5.0 GHz antennas 311 to 314. In common with the disposition in FIG. 4, these antennas are disposed in consideration of a predetermined distance (e.g., λ/2).

Sections of dashed lines in FIG. 12 each represent a group of antennas. In common with the first exemplary embodiment, four antennas existing in one group are connected to an identical switch. Specifically, as shown in FIG. 13, 2.4 GHz antennas 301, 302 and 5.0 GHz antennas 311, 312 are connected to identical switch 171. Similarly, antennas on the other faces are connected to respective switches. In common with the first exemplary embodiment, these switches are connected to switch 172 (a segment defined by a dot-and-dash line in FIG. 13).

Since two groups of antennas exist on one face as described above, connection is formed likewise for another group to which 2.4 GHz antennas 303, 304 and 5.0 GHz antennas 313, 314 belong. In other words, connections for antennas and switches are formed likewise inside a segment defined by another dot-and-dash line in FIG. 13.

Output unit 320 is configured to switch between the two groups described above and enable the selected group to output radio wave signals. Output unit 320 may select one antenna from each of the groups and enable the selected antennas to output radio wave signals. In other words, 2.4 GHz antennas 301, 304 may be enabled to output radio wave signals simultaneously.

In the above-described configuration, two groups of antennas exist on each face. Thus, this configuration allows more detailed measurement than the first exemplary embodiment. Specifically, examples of measurable items in this configuration include interference wave, throughput, signal quality, as well as electric power, and delay spread.

In the measurement of interference waves, the radio wave measurement device allows the user to view interference between two transmitters that each send radio waves over adjacent channels at an identical frequency by measuring transmitted radio waves with a spectrum analyzer while switching between the channels.

In throughput measurement, the radio wave measurement device can be used as an antenna for an electronic device such as a personal computer, for example and enables the viewing of communication performance of the antenna on a personal computer. In response to results of this measurement, the user can design an antenna for use in a personal computer.

In signal quality measurement, the radio wave measurement device allows the user to measure signal degradation by letting two transmitters send different signals at an identical frequency over an identical channel and enabling the user to view these signals with a spectrum analyzer.

As described above, the present exemplary embodiment owing to the increased number of antennas disposed on each of the housing faces provides a more detailed analysis of a radio wave environment than the first exemplary embodiment does.

Third Exemplary Embodiment

Figure 14:
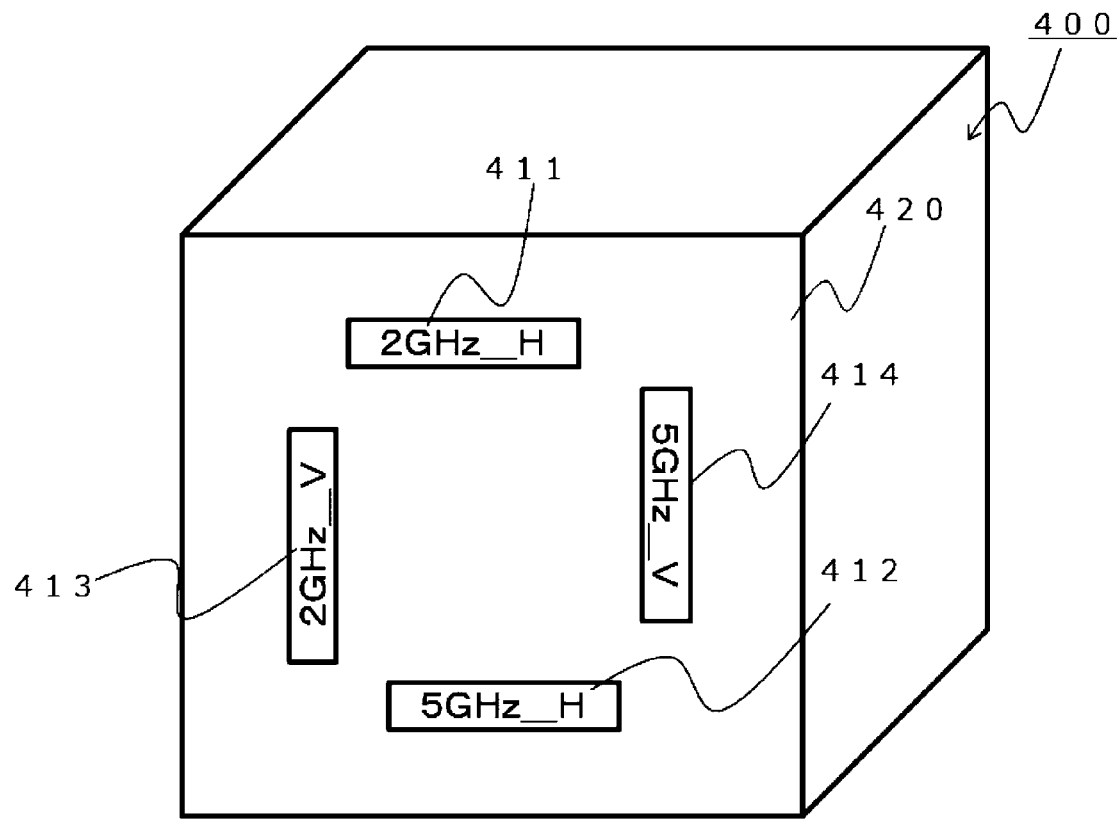
FIG. 14 is an external view of a radio wave measurement device according to a third exemplary embodiment.
Figure 15:
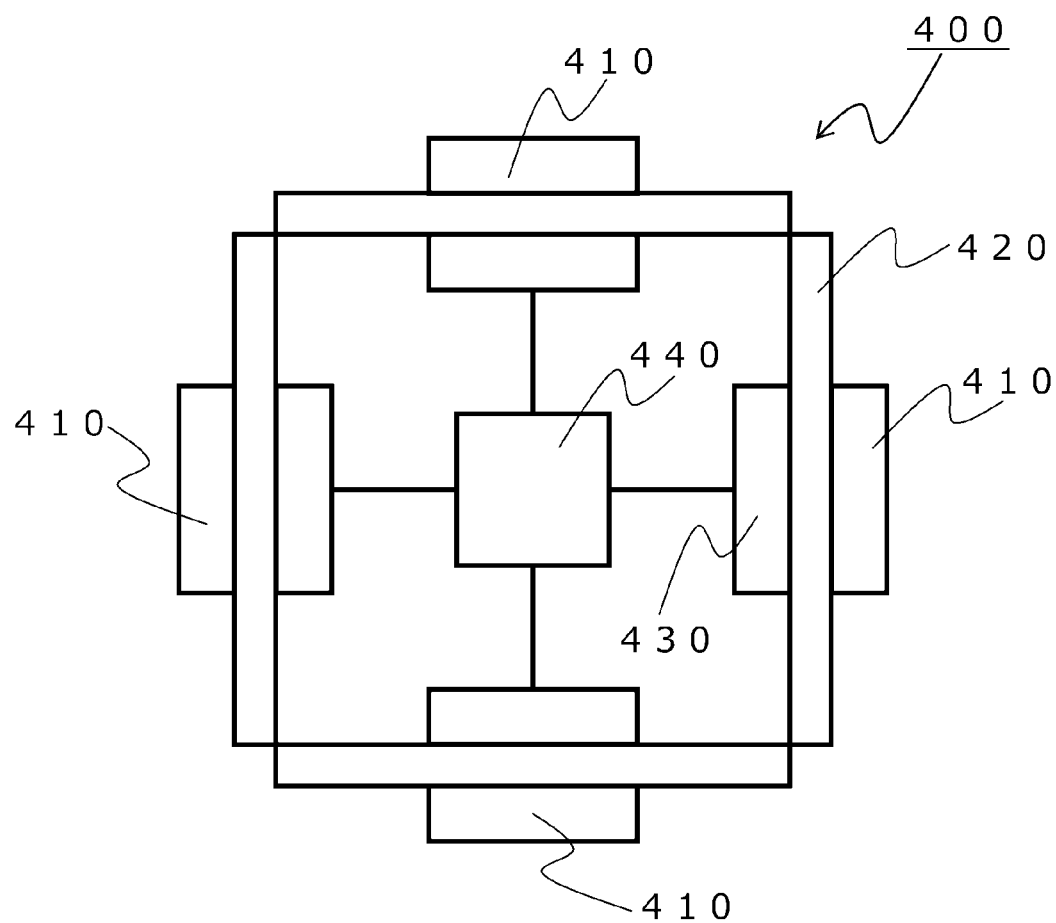
FIG. 15 is a layout sketch of the radio wave measurement device according to the third exemplary embodiment.
Figure 16:
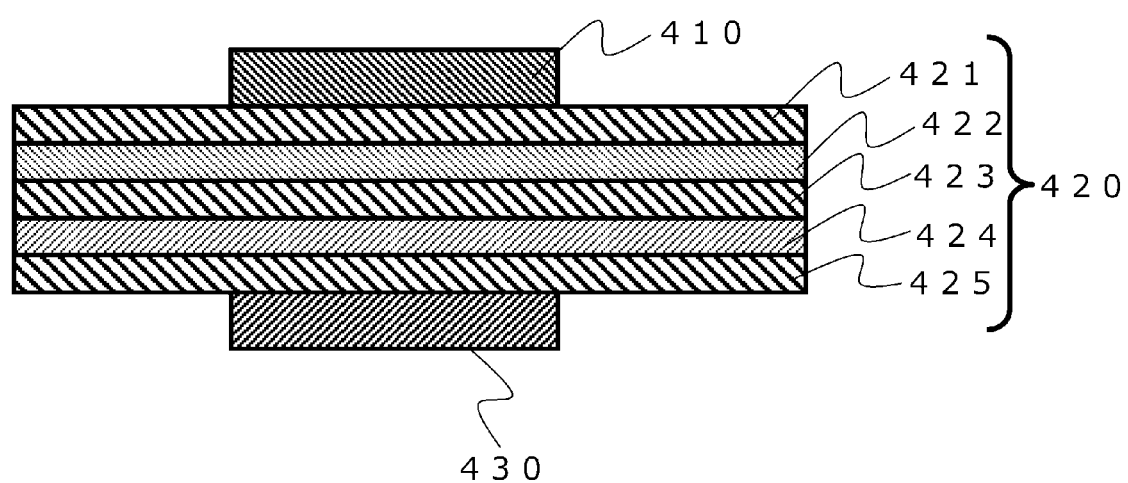
FIG. 16 is a cross-sectional view of the radio wave measurement device according to the third exemplary embodiment.

A third exemplary embodiment will now be described with reference to FIGS. 14 to 16. A radio wave measurement device according to the third exemplary embodiment differs from the radio wave measurement device of the first exemplary embodiment in configuration. FIG. 14 is an external view of the radio wave measurement device according to the third exemplary embodiment. FIG. 15 is a layout sketch of the radio wave measurement device according to the third exemplary embodiment. FIG. 16 is a cross-sectional view of the radio wave measurement device according to the third exemplary embodiment.

The radio wave measurement device according to the third exemplary embodiment includes antennas disposed directly on a surface of a housing, and switches and an output unit that are all disposed inside the housing. As shown in FIG. 14, lateral wall 420 of housing 400 is provided with horizontal polarization 2 GHz-band antenna (2 GHz_H) 411, vertical polarization 2 GHz-band antenna (2 GHz_V) 413, horizontal polarization 5 GHz-band antenna (5 GHz_H) 412, and vertical polarization 5 GHz-band antenna (5 GHz_V) 414. Unlike the first exemplary embodiment provided with fastener 150, these antennas are directly disposed on lateral wall 420. Likewise, other faces of housing 400 are each provided with antennas although no illustration is given.

FIG. 15 shows a disposition of components inside housing 400. Antennas 410 (horizontal polarization antennas 411 and others in FIG. 14) are disposed on an outer perimeter of housing 400. Switches 430 are each disposed on a face opposite to the face of lateral wall 420 on which antenna 410 is disposed. Output unit 440 is disposed at a center of housing 400.

Antennas 410 are disposed on the respective faces in a similar manner, whereas switches 430 are disposed on the respective faces in a similar manner. Output unit 440 is at an identical distance from every unit of antenna 410 and switch 430.

Switches 430 for antennas 410 on the respective faces are disposed on respective lateral walls 420, and output unit 440 shared by every unit of the antenna and the switch is disposed at the center inside housing 400. However, the disposition of these components may be freely specified with proviso that electric lengths to the antennas on the respective faces are equal.

With reference to FIG. 16, reason for the radio wave measurement device configured without fastener 150 will be described. In FIG. 16, lateral wall 420 includes substrate 421, AMC 422, substrate 423, ground 424, and substrate 425 in this order from the face on which antenna 410 is disposed.

AMC 422 is an artificial magnetic conductor (AMC). Because of the inclusion of AMC 422, antenna 410 is permitted to be disposed in parallel with housing wall 420, and the radio wave measurement device can come down in overall size. In common with the first exemplary embodiment, this configuration owing to ground 424 ensures that an antenna receiving radio waves in one of the directions does not receive radio waves coming in the other directions. Consequently, this configuration can implement functions in like manner with the first exemplary embodiment.

Other Exemplary Embodiments

The first to third exemplary embodiments are described above to exemplify techniques disclosed in the present disclosure. However, the technique in the present disclosure is not limited to the foregoing exemplary embodiments, and can also be applied to embodiments in which change, substitution, addition, and omission, for example, are performed. A new exemplary embodiment can also be made by a combination of the components of the first to third exemplary embodiments.

Accordingly, other exemplary embodiments will be described below.

In the first to third exemplary embodiments, the housing has a rectangular parallelepiped shape. However, the housing may be made in any of other shapes (polyhedrons) such as triangular pyramids and hexahedrons, with proviso that the housing is provided with faces corresponding to directions necessary for measurement.

In the first to third exemplary embodiments, control box 140 is disposed below the housing. However, control box 140 may be disposed at other locations such as inside the housing, and an antenna may be disposed on the underside of the housing.

In the first to third exemplary embodiments, the radio wave measurement device acts as a reception device. However, the radio wave measurement device may act as a transmission device that outputs radio waves.

In the first to third exemplary embodiments, the antennas support two frequency bands. However, the antennas may support only one frequency band or may support three or more frequency bands.

In the second exemplary embodiment, the antenna unit includes two groups of antennas. Three or more groups of antennas may be included.

The above exemplary embodiments are an illustration of the technique of the present disclosure. Therefore, various changes, replacements, additions, or omissions may be made to the exemplary embodiments within the scope of claims or their equivalents.

INDUSTRIAL APPLICABILITY

The technique of the present disclosure enables a radio wave measurement device to measure radio waves in a plurality of conditions in a short period of time.

REFERENCE MARKS IN THE DRAWINGS 100 radio wave measurement device
110, 400 housing
121, 122, 123, 124, 125 antenna unit
130 seat
140 control box
150 fastener
161, 162, 411, 412 horizontal polarization antenna
163, 164, 413, 414 vertical polarization antenna
171, 172, 173, 174, 175, 176, 177, 430 switch
180, 320, 440 output unit
191 termination resistor
200 access point
210 obstacle
301, 302, 303, 304 2.4 GHz antenna
311, 312, 313, 314 5.0 GHz antenna

The invention claimed is:

1. A radio wave measurement device comprising:
a housing including a metallic layer;
a horizontal polarization antenna disposed on a face of the housing, the horizontal polarization antenna receiving horizontally polarized waves;
a vertical polarization antenna disposed on the face of the housing on which the horizontal polarization antenna is disposed, the vertical polarization antenna receiving vertically polarized waves;
a switching unit connected to both the horizontal polarization antenna and the vertical polarization antenna; and
an output unit connected to the switching unit,
wherein the switching unit includes a connection part and a resistance part, the connection part being connected to the output unit, the resistance part being connected to a resistor,
wherein the switching unit is configured to switch between the horizontal polarization antenna and the vertical polarization antenna to connect only one of the horizontal polarization antenna and the vertical polarization antenna to the connection part and to connect another one of the horizontal polarization antenna and the vertical polarization antenna to the resistor,
wherein the horizontal polarization antenna is one of a plurality of horizontal polarization antennas and the vertical polarization antenna is one of a plurality of vertical polarization antennas, the plurality of horizontal polarization antennas and the plurality of vertical polarization antennas being disposed to cover a plurality of frequencies, and
wherein a first antenna configured to cover a lower frequency of the frequencies is disposed between an end of the face of the housing and a second antenna configured to cover a higher frequency of the frequencies, the first antenna and the second antenna being included in the plurality of the horizontal polarization antennas and the plurality of the vertical polarization antennas.

2. The radio wave measurement device according to claim 1, wherein the switching unit is one of a plurality of switching units,
wherein the housing is a polyhedron having a plurality of faces that are each provided with a respective one of the horizontal polarization antennas, a respective one of the vertical polarization antennas, and a respective one of the switching units, and
the output unit switches between the plurality of the switching units so as to establish connection to one of the switching units.

3. The radio wave measurement device according to claim 1, wherein the face of the housing is a laminate including a layer of an artificial magnetic conductor and a ground layer.

4. The radio wave measurement device according to claim 1, wherein the switching unit and the output unit are disposed inside the housing.

5. A radio wave measurement device comprising:
a housing including a metallic layer;
a horizontal polarization antenna disposed on a face of the housing, the horizontal polarization antenna receiving horizontally polarized waves;
a vertical polarization antenna disposed on the face of the housing on which the horizontal polarization antenna is disposed, the vertical polarization antenna receiving vertically polarized waves;
a switching unit connected to both the horizontal polarization antenna and the vertical polarization antenna; and
an output unit connected to the switching unit,
wherein the switching unit includes a connection part and a resistance part, the connection part being connected to the output unit, the resistance part being connected to a resistor,
wherein the switching unit is configured to switch between the horizontal polarization antenna and the vertical polarization antenna to connect only one of the horizontal polarization antenna and the vertical polarization antenna to the connection part and to connect another one of the horizontal polarization antenna and the vertical polarization antenna to the resistor, and
wherein the horizontal polarization antenna and the vertical polarization antenna are disposed inward from an end of the housing by one fourth of a wavelength at which the horizontal polarization antenna and the vertical polarization antenna operate.

6. The radio wave measurement device according to claim 5, wherein:
the housing is a polyhedron and the face is one of a plurality of faces of the housing, each of the faces of the housing being provided with a respective one of a plurality of horizontal polarization antennas including the horizontal polarization antenna, a respective one of a plurality of vertical polarization antennas including the vertical polarization antenna, and a respective one of a plurality of switching units including the switching unit, and
the output unit is configured to switch between the plurality of switching units so as to establish connection to one of the plurality of switching units.

7. The radio wave measurement device according to claim 5, wherein the face of the housing is a laminate including a layer of an artificial magnetic conductor and a ground layer.

8. The radio wave measurement device according to claim 5, wherein the switching unit and the output unit are disposed inside the housing.

* * * * *